(12) United States Patent  (10) Patent No.: US 11,073,931 B2
Suto  (45) Date of Patent: Jul. 27, 2021

(54) APPARATUS AND METHOD FOR DETECTING PRESS

(71) Applicant: ALPINE ELECTRONICS, INC., Tokyo (JP)

(72) Inventor: Shunichi Suto, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 17/092,654

(22) Filed: Nov. 9, 2020

(65) Prior Publication Data

US 2021/0173508 A1 Jun. 10, 2021

(30) Foreign Application Priority Data

Dec. 4, 2019 (JP) .............................. JP2019-219488

(51) Int. Cl.
*G06F 3/041* (2006.01)
*B60K 37/02* (2006.01)

(52) U.S. Cl.
CPC ............ *G06F 3/0414* (2013.01); *B60K 37/02* (2013.01); *G06F 3/0412* (2013.01); *B60K 2370/1434* (2019.05); *B60K 2370/152* (2019.05)

(58) Field of Classification Search
CPC ..... G06F 3/0412; G06F 3/0414; B60K 37/02; B60K 2370/1434; B60K 2370/152
See application file for complete search history.

(56) References Cited

U.S. PATENT DOCUMENTS

| 2012/0032907 A1* | 2/2012 | Koizumi | ............... G06F 3/0488 345/173 |
| 2015/0077398 A1* | 3/2015 | Yairi | ................... G06F 3/04883 345/175 |
| 2016/0195989 A1* | 7/2016 | Czelnik | ............... B60R 11/0235 345/174 |
| 2017/0031442 A1* | 2/2017 | Dabic | .................... G06F 3/016 |

(Continued)

FOREIGN PATENT DOCUMENTS

| EP | 3 402 074 | 11/2018 |
| JP | 2012-181703 | 9/2012 |

(Continued)

OTHER PUBLICATIONS

Extended European Search Report for 20 20 9807 dated Apr. 30, 2021, 10 pgs.

*Primary Examiner* — Ryan A Lubit
(74) *Attorney, Agent, or Firm* — Brinks Gilson & Lione

(57) ABSTRACT

In determining a definitive value, if a measured value detected at one timing changes by an amount less than a reference amount from a definitive value generated at a timing one cycle before the one timing, a definitive-value determination unit of a press detection apparatus determines the measured value detected at the one timing as a definitive value at the one timing, and if the measured value detected at the one timing has changed by an amount equal to or more than the reference amount from the definitive value at the preceding timing, the definitive-value determination unit determines a value obtained by adding the reference amount to the definitive value at the preceding timing as a definitive value at the one timing. This allows a value in which the influence of vibration is limited to be used in a determination of a pressing operation.

13 Claims, 5 Drawing Sheets

(56) References Cited

U.S. PATENT DOCUMENTS

2017/0322664 A1* 11/2017 Park ................... B60K 35/00
2017/0336891 A1* 11/2017 Rosenberg .......... G06F 3/04166
2018/0113512 A1* 4/2018 Kang .................. G06F 3/04817

FOREIGN PATENT DOCUMENTS

| JP | 2018-005781 | 1/2018 |
| JP | 2018-072952 | 5/2018 |
| KR | 2013 0097280 | 9/2013 |

* cited by examiner

AREA ENCLOSED BY [ ] ··· CONTACT DETECTABLE AREA 3
AREA ENCLOSED BY [ ] ··· PRESS DETECTABLE AREA 5

APPARATUS AND METHOD FOR DETECTING PRESS

RELATED APPLICATION

The present application claims priority to Japanese Patent Application Number 2019-219488, filed Dec. 4, 2019, the entirety of which is hereby incorporated by reference.

BACKGROUND

1. Field of the Invention

The present invention relates to an apparatus and a method for detecting a press and is particularly suitable for use in an apparatus and a method for detecting a user's pressing operation.

2. Description of the Related Art

A known press detection apparatus for detecting a user's pressing operation on a press target detects the user's pressing operation while reducing the influence of vibration applied to the press target. An example of the vibration applied to the press target is, in the case where the press target is an object (for example, a touch panel) provided in a vehicle, a vibration that is applied to the press target caused by the vibration of the vehicle.

For example, Japanese Unexamined Patent Application Publication No. 2018-005781 describes an operating apparatus 1 (a press detection apparatus) installed in a vibration environment. Specifically, Japanese Unexamined Patent Application Publication No. 2018-005781 describes an operating apparatus 1 including a load sensor 20 that outputs a load signal according to a load applied to a touchpad 10 (a press target). The operating apparatus 1 samples a load signal $F_1$ during a non-touch operation and a load signal $F_2$ during a touch operation in a predetermined cycle, transforms the signals to gain signals for frequencies by means of fast Fourier transform (FFT) or the like, determines a gain difference based on the load signals during the non-touch operation and the touch operation, and determines whether the touchpad 10 is touched on the basis of the gain difference.

Japanese Unexamined Patent Application Publication No. 2018-072952 describes an operating apparatus 1 (a press detection apparatus) installed in a vibration environment. Specifically, Japanese Unexamined Patent Application Publication No. 2018-072952 describes an operating apparatus 1 including a load detection unit 12 for detecting a load F applied to the operating surface 100 of a touchpad 10 (a press target). The operating apparatus 1 determines the load F to be the vibration of the vehicle (determines that the load F is not a pressing operation) when the load F becomes a first load threshold $Th_1$ or less, and "an elapsed time after $Th_1 \leq F$ is reached until $Th_2 \leq F$ is reached" is equal to or less than a predetermined time (where, if the direction of a normal to the operating surface 100 is negative, $Th_1$ is a first load threshold which is a negative value, and $Th_2$ is a second load threshold which is a positive value, and a third load threshold $Th_3$ ($Th_2 > Th_3$), which are defined in advance).

Japanese Unexamined Patent Application Publication No. 2012-181703 describes an in-vehicle display apparatus 10 including a touch panel 11 that receives a press-down operation (a pressing operation). The display apparatus 10 detects a pressure value applied to the touch panel 11, blocks a frequency band corresponding to the vibration of the vehicle on the basis of the detected pressure value using a low-pass filter (LPF) or another filter, and calculates the pressed position on the basis of the result of blocking. The display apparatus 10 described in Japanese Unexamined Patent Application Publication No. 2012-181703 estimates the vibration state of the vehicle on the basis of road information, the vehicle speed, and so on and dynamically changes the frequency band to be blocked on the basis of the estimated vibration state.

Press detection apparatuses that detect a pressing operation that the user performs on the press target are required to be capable of determining the pressing operation while reducing the influence of vibration by means of the simplest possible method. This is because using a simple method provides the advantages of reducing the processing load, saving the storage area, and so on. However, the technique of Japanese Unexamined Patent Application Publication No. 2018-005781 can be improved in terms of using a simple method because it is necessary to sample the load signal $F_1$ during a non-touch operation and the load signal $F_2$ during a touch operation in a predetermined cycle and to convert the load signals to gain signals for frequency by means of FFT or the like. The technique of Japanese Unexamined Patent Application Publication No. 2018-072952 can be improved in terms of using a simple method because it is necessary to measure the elapsed time after a timing at which one event occurred until a timing at which another event occurred in order to determine whether the load F is caused by the vibration of the vehicle. The technique of Japanese Unexamined Patent Application Publication No. 2012-181703 can be improved in terms of a using simple method because it is necessary to block a frequency band corresponding to the vibration state of the vehicle on the basis of the detected pressure value using a LPF or another filter and it is necessary to estimate the vibration state on the basis of various external factors.

SUMMARY

Accordingly, it is an object of the present disclosure to provide a new simple method for determining the pressing operation while reducing the influence of vibration.

In the present disclosure, a measured value indicating a pressing force applied to a press target is detected in a predetermined cycle, and a definitive value for use in the determination of a pressing operation is determined on the basis of the measured value. In determining the definitive value, if a measured value detected at one timing changes by an amount less than a reference amount from a definitive value generated at a timing of one cycle before the one timing, the measured value detected at the one timing is determined as a definitive value at the one timing. If the measured value detected at the one timing has changed by an amount equal to or more than the reference amount from the definitive value at the preceding timing, a value obtained by adding the reference amount to the definitive value at the preceding timing is determined as a definitive value at the one timing.

The waveform of a pressing force applied to a press target due to a vibration is generally a high-frequency waveform. For this reason, in intermittently detecting a measured value indicating a pressing force applied to the press target in a predetermined cycle, vibration may cause a steep change in a measured value detected at the next timing from that at one timing. According to the embodiment of the invention with the above configuration, if the measured value at one timing changes by an amount equal to or greater than the reference amount with respect to the definitive value at the preceding timing, in other words, when the measured value is changed steeply owing to the vibration, not the measured value itself in which the influence of the vibration is not excluded, but the sum of the definitive value at the preceding timing and the reference value, that is, a value in which the influence of the vibration is limited, is used in a determination of the pressing operation, thus allowing a determination of the pressing operation while reducing the influence of the vibration.

In other words, the embodiment allows a determination of the pressing operation while reducing the influence of the vibration by using a simple method using stereotypical simple processing, that is, comparison of the amount of a change in the measured value at one timing from the definitive value at the preceding timing with the reference amount, and determination of a definitive value using an alternative method according to the comparison result, without the need for conversion to gain signals for frequencies using FFT, measurement of the time from one timing to another timing, cutting a predetermined frequency using a LPF, specification of a predetermined frequency band considering external factors, and other processing.

DETAILED DESCRIPTION OF THE PREFERRED EMBODIMENTS

Figure 1:
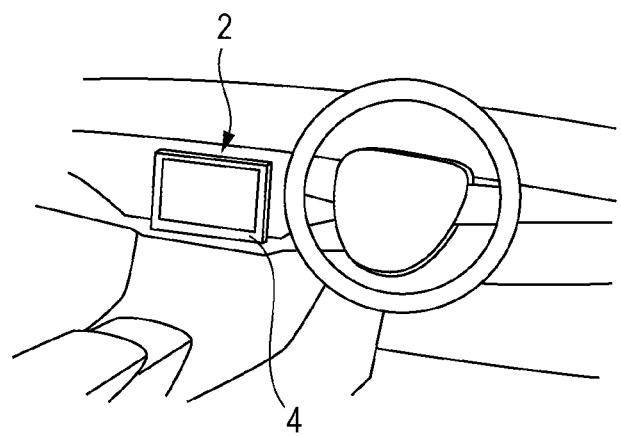
FIG. 1 is a diagram illustrating a state in which a display input device is provided in the passenger compartment of a vehicle.
Figure 2:
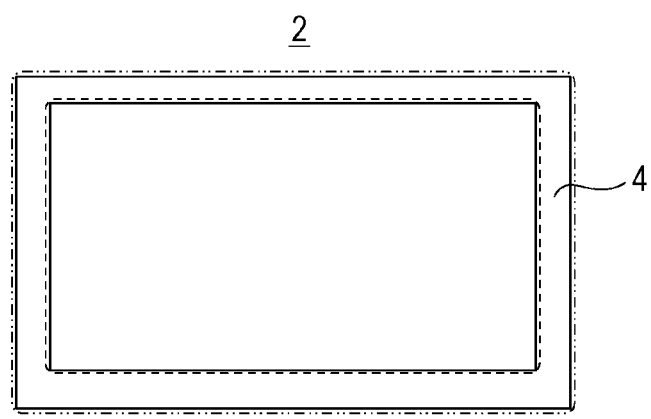
FIG. 2 is a front view of the display input device.

An embodiment of the present invention will be described below with reference to the drawings. FIG. 1 is a diagram illustrating a state in which a display input device 2 (corresponding to "a touch input device") connected to a press detection apparatus 1 according to the embodiment (FIG. 4) is provided in the passenger compartment of a vehicle. FIG. 2 is a front view of the display input device 2.

The display input device 2 is a device having the function of displaying an image and the function of receiving a user input of a touch operation (a so-called touch screen). As illustrated in FIG. 2, a contact detectable area 3, which is the largest area in which a user touch operation can be detected, is formed on the front of the display input device 2. The contact detectable area 3 is equal to the largest image display area. A press detectable area 5 is formed, on the front of the display input device 2, in an area including the contact detectable area 3 and the front area of a frame member 4 surrounding the contact detectable area 3. The press detectable area 5 is equal to the entire front area of the display input device 2. The contact detectable area 3 and the press detectable area 5 will be described in detail later.

Figure 3:
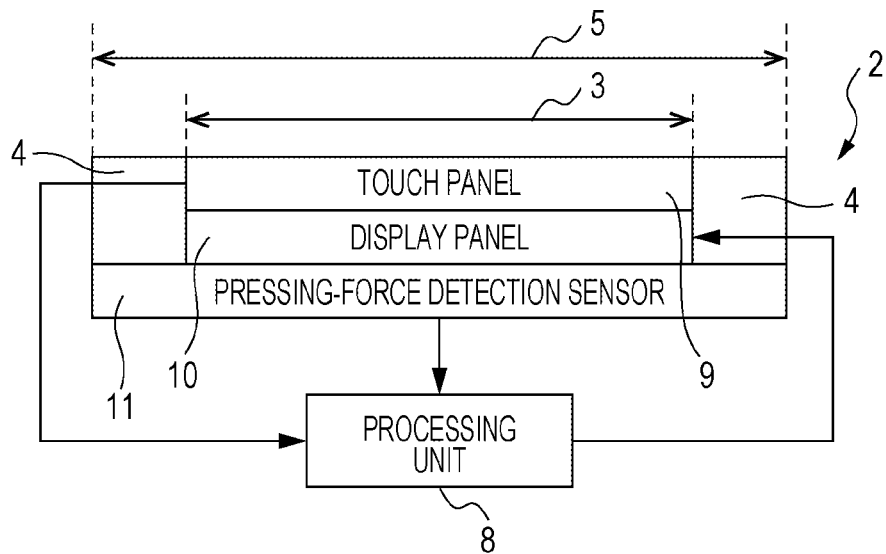
FIG. 3 is a diagram illustrating an example configuration of a processing unit incorporating a press detection apparatus according to an embodiment of the invention and a display input device.

FIG. 3 is a schematic diagram illustrating an example configuration of a processing unit 8 including the press detection apparatus 1 according to the embodiment and the display input device 2 (in particular, the display input device 2). As illustrated in FIG. 3, the display input device 2 includes a touch panel 9, a display panel 10, and a pressing-force detection sensor 11. FIG. 3 is a diagram for clarifying the relationship among the touch panel 9, the display panel 10, and the pressing-force detection sensor 11, and the relationship among those components, the contact detectable area 3, and the press detectable area 5, schematically illustrating the components of the display input device 2 in a simplified manner.

As illustrated in FIG. 3, a front area of the display input device 2 corresponding to the entire front area of the touch panel 9 is provided with the contact detectable area 3 in which contact on the touch panel 9 can be detected. The touch panel 9 detects contact to the contact detectable area 3 in a predetermined cycle and outputs contact position information indicating the coordinates of the contact position (if contact is not detected, the coordinates indicating the non-detection) to the processing unit 8. The touch panel 9 continuously executes contact detection and output of the contact position information in a predetermined cycle while the power of the processing unit 8 is on.

The display panel 10 is disposed on the back of the touch panel 9. The display panel 10 displays an image generated by the processing unit 8. Examples include a liquid crystal panel and an organic electroluminescence (EL) panel.

The frame member 4 is provided so as to surround the touch panel 9 and the display panel 10. The touch panel 9 and the display panel 10 are supported by the frame member 4.

The display input device 2 is provided with the pressing-force detection sensor 11 on the back of the display panel 10. As illustrated in FIG. 3, the entire front area of the pressing-force detection sensor 11 includes the contact detectable area 3 (the entire front area of the touch panel 9) and the front area of the frame member 4 surrounding the contact detectable area 3. In other words, the entire front area of the pressing-force detection sensor 11 is equal to the entire front area of the display input device 2. The press detectable area 5 is formed over the entire front area of the display input device 2.

The pressing-force detection sensor 11 detects a pressing force applied to the press detectable area 5 in a predetermined cycle and outputs pressing force information indicating the pressing force to the processing unit 8. The pressing-force detection sensor 11 continuously executes the detection of the pressing force and the output of the pressing force information in a predetermined cycle while the power of the processing unit 8 is on.

The press detection apparatus 1 according to the embodiment does not determine contact to the contact detectable area 3 to be valid only when detecting the contact. The press detection apparatus 1 detects a pressing force applied to the press detectable area 5 in addition to the contact to the contact detectable area 3 and determines the contact to be valid only when detecting contact to the contact detectable area 3 and a definitive value based on the pressing force has become a threshold or greater. Thus, only when the user performs a pressing operation so as to press down the contact detectable area 3, the contact is valid. This allows the user to perform a reliable operation to prevent the occurrence of an erroneous operation. The display input device 2 is disposed in a vehicle. For this reason, the vibration generated in the vehicle is transferred to the display input device 2. The press detection apparatus 1 according to the embodiment executes determination of the pressing operation while reducing the influence of the vibration.

The configuration and processing of the press detection apparatus 1 will be described in detail below. For the convenience of description, suppose that the display panel 10 displays a graphical user interface (GUI) in which a plurality of accessible objects are displayed and that a user pressing operation is performed to select the objects. When the pressing operation is determined to be valid, the screen of the display panel 10 changes in correspondence with the selected object.

Figure 4:
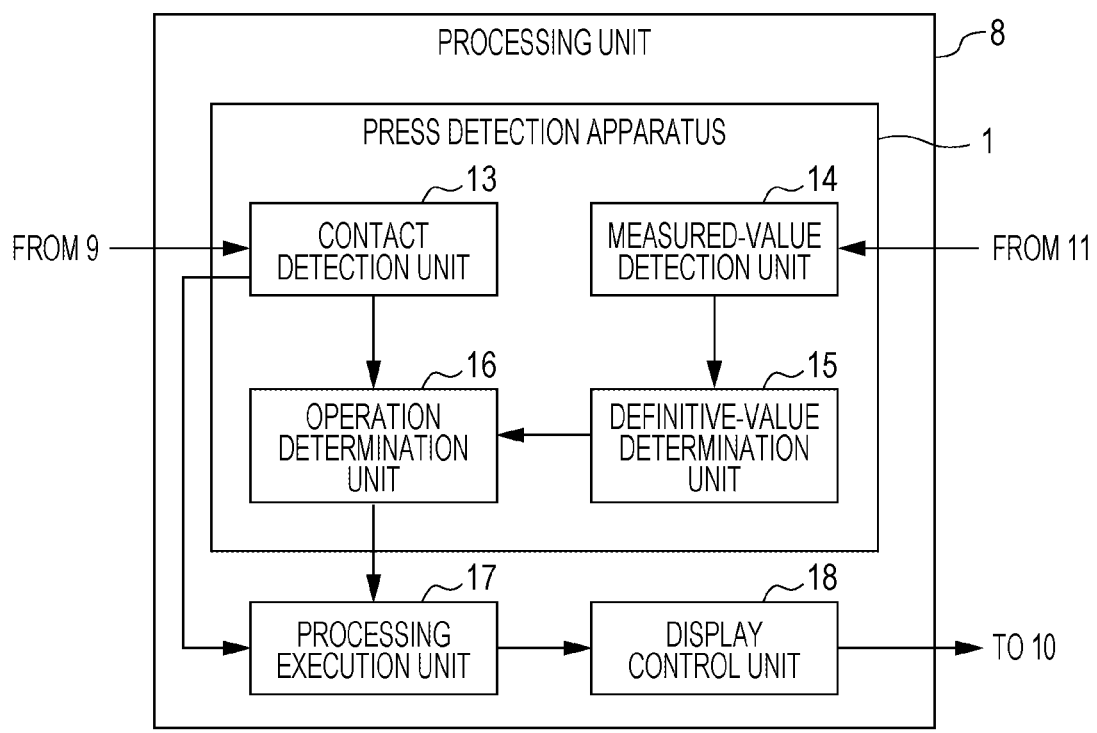
FIG. 4 is a block diagram illustrating an example of the functional configuration of the processing unit incorporating the press detection apparatus according to the embodiment of the invention.

FIG. 4 is a block diagram illustrating an example of the functional configuration of the processing unit 8 including the press detection apparatus 1 according to the embodiment. As illustrated in FIG. 4, the processing unit 8 according to the embodiment includes, as its functional configuration, a contact detection unit 13, a measured-value detection unit 14, a definitive-value determination unit 15, an operation determination unit 16, a processing execution unit 17, and a display control unit 18. Among them, the contact detection unit 13, the measured-value detection unit 14, the definitive-value determination unit 15, and the operation determination unit 16 constitute the press detection apparatus 1 according to the embodiment.

The functional blocks 13 to 18 can be any of hardware, a digital signal processor (DSP), and software. In the case of software, the functional blocks 13 to 18 actually include a central processing unit (CPU), a random access memory (RAM), a read-only memory (ROM), and so on of a computer and are implemented by operating programs stored in recording media, such as the RAM, the ROM, a hard disk, and a semiconductor memory.

The contact detection unit 13 determines whether the contact detectable area 3 is touched on the basis of contact position information input from the touch panel 9 in a predetermined cycle, and if the contact detectable area 3 is touched, detects the contact position and outputs detected-contact-position information indicating the detected contact position to the processing execution unit 17.

The measured-value detection unit 14 detects a measured value indicating a pressing force applied to the press detectable area 5 on the basis of pressing force information received from the pressing-force detection sensor 11 in a predetermined cycle. In other words, the measured value detected by the measured-value detection unit 14 is a value indicating the actual pressing force itself detected by the pressing-force detection sensor 11. The measured-value detection unit 14 outputs the detected measured value to the definitive-value determination unit 15.

The definitive-value determination unit 15 determines a definitive value for use in the determination of a pressing operation on the basis of the measured value detected by the measured-value detection unit 14. The processing of the definitive-value determination unit 15 will now be described.

The definitive-value determination unit 15 receives a measured value from the measured-value detection unit 14 in a predetermined cycle. The definitive-value determination unit 15 executes the following processing every time the measured value is input. Let timing N be a timing at which the measured value is input, and timing N−1 be a timing one cycle before timing N. If the measured value input from the measured-value detection unit 14 at timing N is less than the sum of a definitive value that the definitive-value determination unit 15 determines by itself at timing N−1 and a predetermined increase reference amount Z, then the definitive-value determination unit 15 determines the measured value input at timing N as a definitive value at timing N. In contrast, if the measured value input at timing N is equal to or greater than the sum of the definitive value determined at timing N−1 and the increase reference amount Z, then the definitive-value determination unit 15 determines "the sum of the definitive value determined at timing N−1 and the increase reference amount Z" as a definitive value at the timing N.

Figure 5:
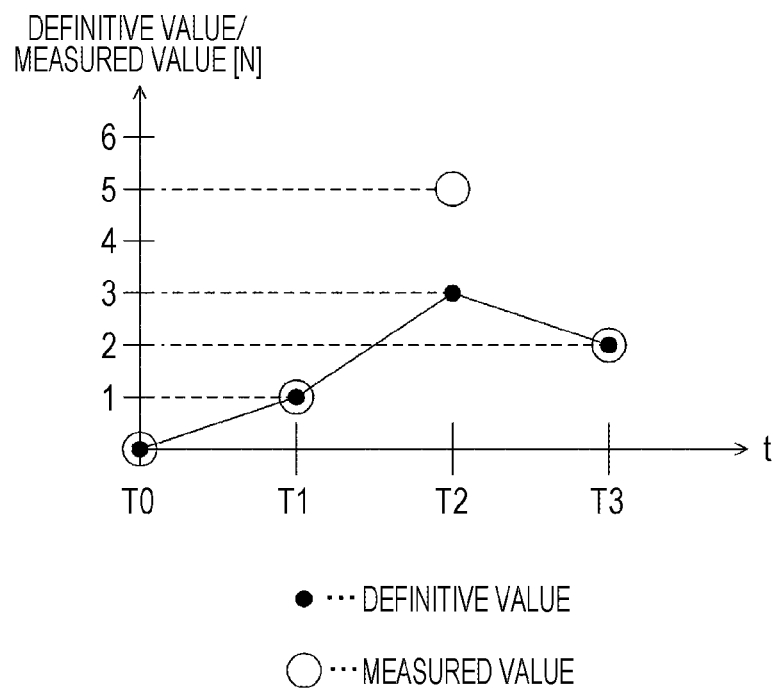
FIG. 5 is a diagram illustrating changes in the measured value and the definitive value.

FIG. 5 is a diagram illustrating changes in the measured value and the definitive value using graphs on a chart in which the passage of time is expressed on the horizontal axis and the measured value and the definitive value (unit: [N]) are expressed on the vertical axis. The horizontal axis of FIG. 5 is scaled according to the cycle in which the definitive-value determination unit 15 determines the definitive value (the cycle in which the measured-value detection unit 14 detects the measured value). The processing of the definitive-value determination unit 15 will be specifically described with reference to FIG. 5 on the assumption that the increase reference amount Z is 2[N].

Referring to FIG. 5, the measured value and the definitive value are 0[N] at timing T0. In this case, the definitive-value determination unit 15 determines the upper limit at timing T1 to be 2[N]. The upper limit at timing T1 is the maximum value that the definitive value can take at timing T1, and the definitive value cannot exceed the upper limit at any timing. The upper limit at timing T1 is determined from "definitive value (0[N]) at timing T0+increase reference amount Z (2[N])".

Referring to FIG. 5, when a measured value indicating 1[N] is input at timing T1, the definitive-value determination unit 15 determines the definitive value to be 1[N]. This is because the measured value (1[N]) input at timing T1 is less than the upper limit (2[N]) at timing T1.

Next, the definitive-value determination unit 15 determines the upper limit at timing T2 to be 3[N]. The upper limit at timing T2 is determined from "definitive value (1[N]) at timing T1+increase reference amount Z (2[N])".

When a measured value indicating 5[N] is input at timing T2, the definitive-value determination unit 15 determines the definitive value to be 3[N], which is the same as the upper limit (3[N]) at timing T2. This is because the measured value (5[N]) input at timing T2 is greater than the upper limit (3[N]) at timing T2.

Next, the definitive-value determination unit 15 determines the upper limit at timing T3 to be 5[N]. The upper limit at timing T3 is determined from "definitive value (3[N]) at timing T2+increase reference amount Z (2[N]).

When a measured value indicating 2[N] is input at timing T3, the definitive-value determination unit 15 determines the definitive value to be 2[N]. This is because the measured value (2[N]) input at timing T3 is less than the upper limit (5[N]) at timing T3.

Every time a measured value is input in a predetermined cycle, the definitive-value determination unit 15 determines a definitive value on the basis of the input measured value and outputs the definitive value to the operation determination unit 16. The advantageous effect of the determination of the definitive value with the definitive-value determination unit 15 using the above method will be described later.

If the definitive value determined by the definitive-value determination unit 15 becomes equal to or greater than a predetermined press threshold from a value less than the press threshold while a contact to the contact detectable area 3 is detected by the contact detection unit 13, then the operation determination unit 16 determines the contact detected by the contact detection unit 13 to be valid. When the operation determination unit 16 determines that the contact is valid, the operation determination unit 16 outputs validity notification information indicating that the contact is valid to the processing execution unit 17.

When the processing execution unit 17 receives the validity notification information from the operation determination unit 16, the processing execution unit 17 recognizes that the detected contact is valid and recognizes the contact position on the basis of detected-contact-position information input from the contact detection unit 13 at the time when the validity notification information is input. Next, the processing execution unit 17 executes predetermined processing for an object displayed at the contact position of the GUI of the display panel 10.

The display control unit 18 controls the display so that an image generated by the processing execution unit 17 on the basis of the result of predetermined processing executed by the processing execution unit 17 is displayed on the display panel 10. This allows switching images displayed on the display panel 10 according to the user's pressing operation on the press detectable area 5.

Figure 6:
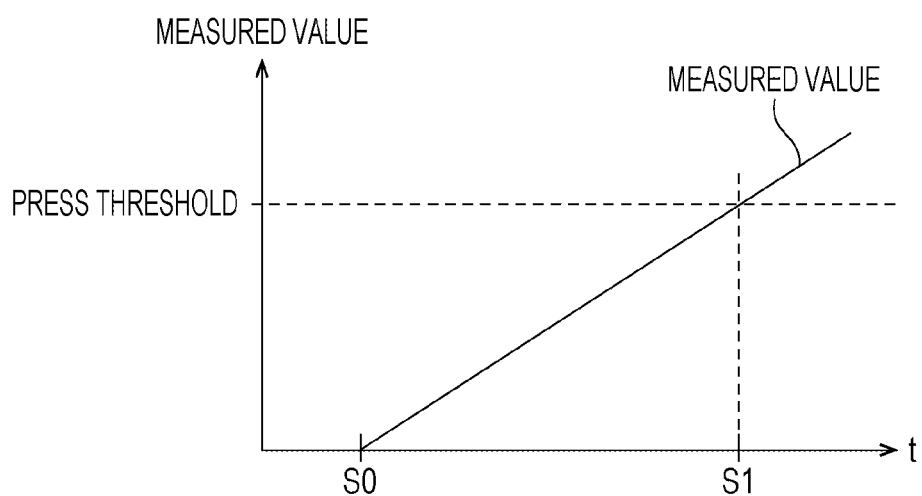
FIG. 6 is a diagram illustrating a change in the measured value.
Figure 7:
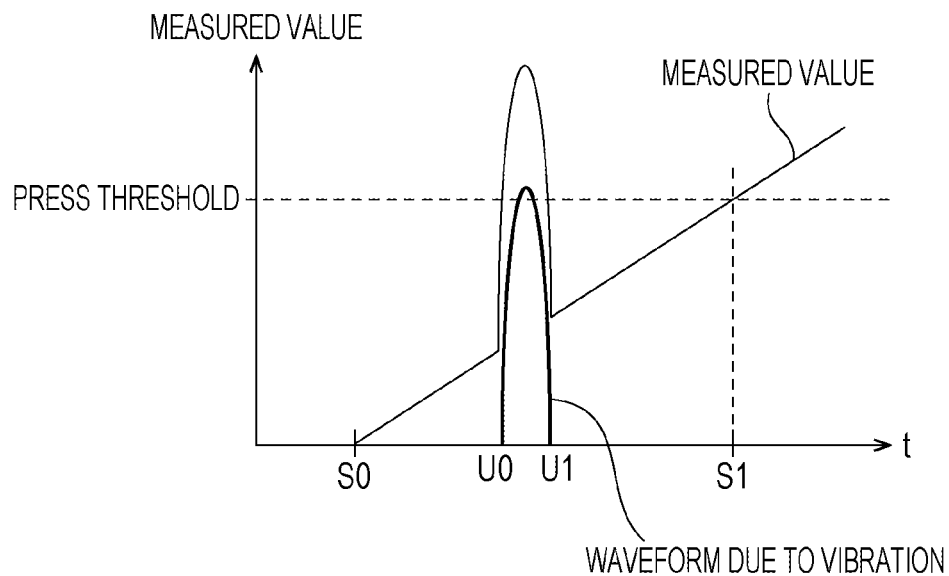
FIG. 7 is a diagram illustrating a change in the measured value.
Figure 8:
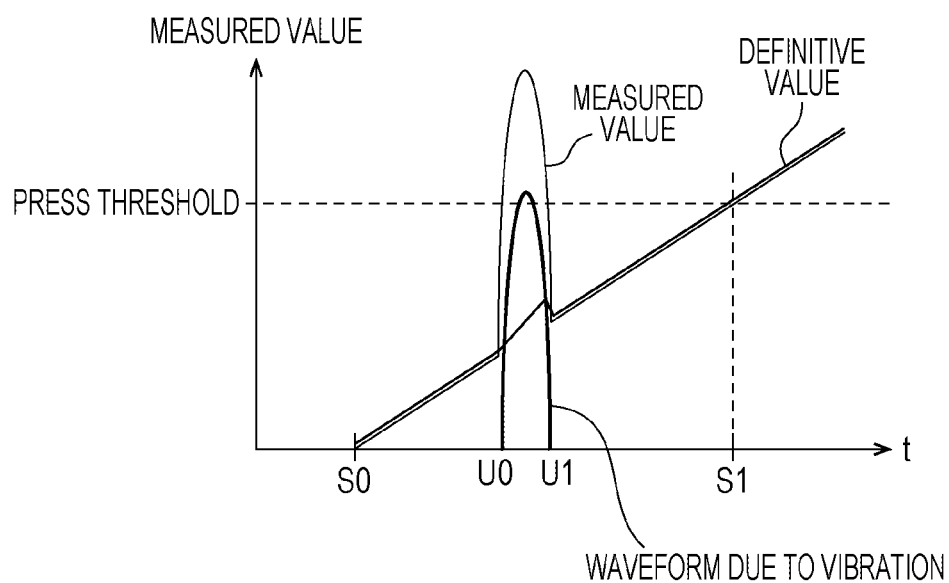
FIG. 8 is a diagram illustrating changes in the measured value and the definitive value.

The embodiment provides the following advantageous effect. FIGS. 6, 7, and 8 are diagrams illustrating changes in the measured value (in FIG. 8, the measured value and the definitive value) using graphs on charts in which the passage of time is expressed on the horizontal axis, and the measured value is expressed on the vertical axis, as in FIG. 5, to describe the advantageous effect of the embodiment.

Suppose that the display input device 2 is not influenced by the vibration at all. In this case, when the user performs a pressing operation, the measured value rises gradually, with the passage of time from timing S0 at which the pressing operation is started, to reach a press threshold at timing S1 after a certain time has passed, as illustrated in FIG. 6. This is because the user recognizes that a press-down operation is needed to make the contact (touch operation) valid, and the user presses down the contact position until the contact becomes valid.

Suppose that a vibration is applied to the display input device 2 after the user starts a pressing operation until the measured value reaches the press threshold. The waveform of a pressing force applied to the display input device 2 due to a vibration is generally a high-frequency waveform. In this case, the measured value may steeply increase to exceed the press threshold because of the vibration.

FIG. 7 illustrates a change in the measured value when a vibration is generated in the example of FIG. 6. The thick line in FIG. 7 indicates the waveform of the pressing force applied to the pressing-force detection sensor 11 caused by the vibration from timing U0 to timing U1 (timing S0<timing U0<timing U1<timing S1) (simplified for the convenience of description). In the example of FIG. 7, the measured value increases steeply from timing U0 because of the vibration to reach the press threshold in the vicinity of timing U0.

If determination of the pressing operation is performed by comparing the measured value with the press threshold, without applying the present invention, the contact is determined to be valid in the vicinity of timing U0. In this case, the user, who recognizes that the contact becomes valid only when a pressing operation is performed, can have the impression that processing on the validity/invalidity of the contact is performed in an abnormal manner to erroneously believe that a problem has occurred.

FIG. 8 is a diagram illustrating a change in the definitive value determined by the definitive-value determination unit 15 of the embodiment in the case of FIG. 7. In FIG. 8, the definitive value is increased a little for viewability of the drawing so that the definitive value and the measured value are plotted at different positions even with the same value. In contrast, according to the embodiment, if the measured value increases steeply to exceed the increase reference amount Z in one cycle, the amount of increase in the definitive value at the present timing from the preceding timing is limited to the increase reference amount Z. For this reason, even if the measured value changes steeply because of vibration, as illustrated from around timing U0 to around timing U1 in FIG. 8, the definitive value does not change steeply, thus reducing the possibility that the definitive value for use in determination of the pressing operation exceeds the press threshold because of the vibration.

In other words, according to the embodiment, in the case where the measured value at one timing changes by an amount equal to or greater than the reference amount with respect to the definitive value at the preceding timing, in other words, when the measured value may be changed steeply owing to the vibration, not the measured value itself in which the influence of the vibration is not excluded, but the sum of the definitive value at the preceding timing and the reference value, that is, a value in which the influence of the vibration is limited, is used in a determination of the pressing operation, thus allowing the determination of the pressing operation while reducing the influence of the vibration.

Accordingly, the embodiment allows a determination of the pressing operation while reducing the influence of the vibration by using a simple method using simple processing, that is, comparison of the amount of a change in the measured value at one timing from the definitive value at the preceding timing with the reference amount and determination of a definitive value using an alternative method according to the comparison result. This method does not need conversion to gain signals for frequencies using FFT, measurement of the time from one timing to another timing, cutting a predetermined frequency using a LPF, specification of a predetermined frequency band considering external factors, and other processing.

Next, an example of the operation of the definitive-value determination unit 15 according to the embodiment will be described with reference to the flowchart of FIG. 9. The flowchart of FIG. 9 illustrates the operation of the definitive-value determination unit 15 particularly when a measured value is input from the measured-value detection unit 14.

Figure 9:
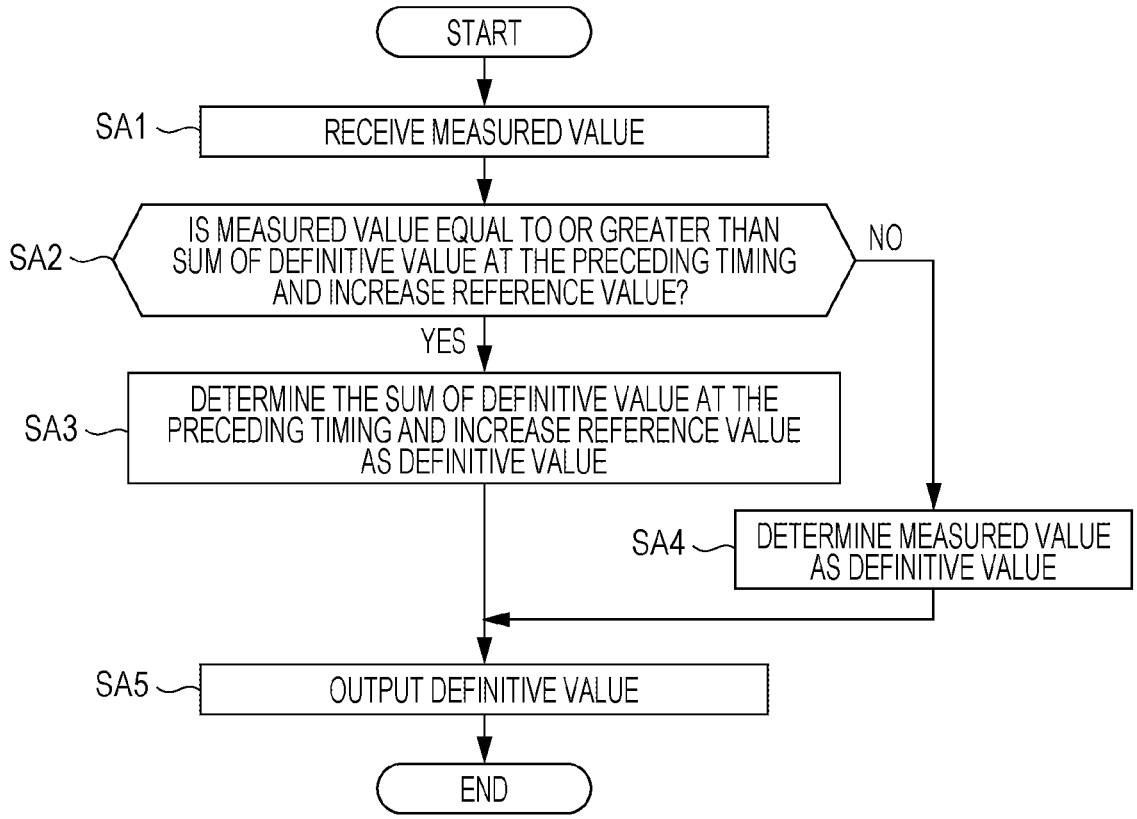
FIG. 9 is a flowchart illustrating an example of the operation of a definitive-value determination unit according to an embodiment of the invention.

As illustrated in FIG. 9, the definitive-value determination unit 15 receives a measured value from the measured-value detection unit 14 (step SA1). Next, the definitive-value determination unit 15 determines whether the received measured value is equal to or greater than the sum of the definitive value at the preceding timing and the increase reference amount Z (step SA2). If the received measured value is equal to or greater than the sum of the definitive value at the preceding timing and the increase reference amount Z (step SA2: YES), then the definitive-value determination unit 15 determines the sum of the definitive value at the preceding timing and the increase reference amount Z as a definitive value at this timing (step SA3). After the processing of step SA3, the processing procedure goes to step SA5.

If the received measured value is not equal to or greater than the sum of the definitive value at the preceding timing and the increase reference amount Z (step SA2: NO), then the definitive-value determination unit 15 determines the definitive value received at step SA1 as the definitive value at this timing (step SA4). After the processing of step SA4, the processing procedure goes to step SA5. In step SA5, the definitive-value determination unit 15 outputs the definitive value to the operation determination unit 16.

Modifications

Next, modifications of the embodiment will be described. In the above embodiment, if the measured value received from the measured-value detection unit 14 at timing N is less than the sum of the definitive value determined by the definitive-value determination unit 15 itself at timing N−1 and the predetermined increase reference amount Z, the definitive-value determination unit 15 determines the measured value received at timing N as the definitive value at the timing N. In contrast, if the measured value received at timing N is equal to or greater than the sum of the definitive value determined at timing N−1 and the increase reference amount Z, the definitive-value determination unit 15 determines the summed value as the definitive value at timing N. The processing (the processing in which the definitive-value determination unit 15 determines the definitive value in this embodiment) is hereinafter referred to as "first processing".

The definitive-value determination unit 15 may execute the following processing in place of the first processing. Specifically, if the measured value received from the measured-value detection unit 14 at timing N is greater than the definitive value determined at timing N−1 by the definitive-value determination unit 15 itself minus a predetermined decrease reference amount Y, then the definitive-value determination unit 15 determines the measured value received at timing N as the definitive value at timing N. In contrast, if the measured value received at timing N is equal to or less than the definitive value determined at timing N−1 minus the decrease reference amount Y, then the definitive-value determination unit 15 determines "the definitive value determined at timing N−1 minus the decrease reference amount Y" as the definitive value at timing N. This processing is hereinafter referred to as "second processing".

Figure 10:
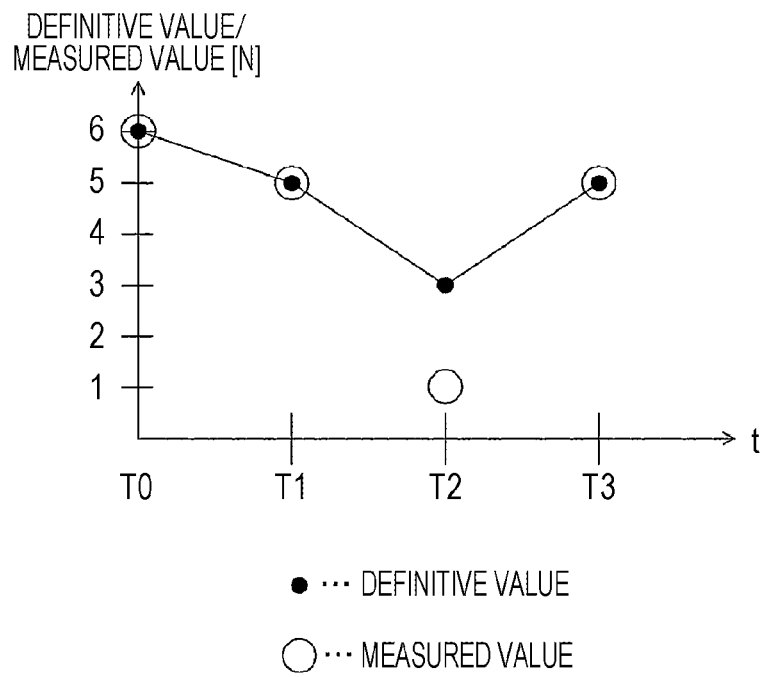
FIG. 10 is a diagram illustrating changes in the measured value and the definitive value.

FIG. 10 is a diagram illustrating changes in the measured value and the definitive value of graphs on the chart according to FIG. 5. The second processing will be described specifically with reference to FIG. 10 on the assumption that the increase reference amount Z is 2[N].

Referring to FIG. 10, the measured value and the definitive value are 6[N] at timing T0. In this case, the definitive-value determination unit 15 determines the lower limit at timing T1 to be 4[N]. The lower limit at timing T1 indicates the minimum value that the definitive value can take at timing T1. The definitive value cannot fall below the lower limit at each timing. The lower limit at timing T1 is determined from "definitive value (6[N]) at timing T0−decrease reference amount Y (2[N])".

Referring to FIG. 10, when a measured value indicating 5 [N] is input at timing T1, the definitive-value determination unit 15 determines the definitive value to be 5[N]. This is because the measured value (5[N]) received at timing T1 is greater than the lower limit (4[N]) at timing T1.

Next, the definitive-value determination unit 15 determines the lower limit at timing T2 to be 3[N]. The lower limit at timing T2 is determined from "definitive value (5[N]) at timing T1−decrease reference amount Y (2[N])".

When a measured value indicating 1[N] is input at timing T2, then the definitive-value determination unit 15 determines the definitive value to be the same 3[N] as the lower limit (3[N]) at timing T2. This is because the measured value (1[N]) received at timing T2 is less than the lower limit (3[N]) at timing T2.

Next, the definitive-value determination unit 15 determines the lower limit at timing T3 to be 1[N]. The lower limit at timing T3 is determined from "definitive value (3[N]) at timing T2−decrease reference amount Y (2[N])".

When a measured value indicating 5[N] is input at timing T3, the definitive-value determination unit 15 determines the definitive value to be 5[N]. This is because the measured value (5[N]) received at timing T3 is greater than the lower limit (1[N]) at timing T3.

The second processing is advantageous in the following case. For example, suppose that the press target is disposed in an environment influenced by vibrations. This is a case in which, when the definitive value falls below a predetermined threshold while the user is pressing the press target, an operation (an operation for cancelling the press on the press target) is determined to be valid, and a predetermined processing is performed. In such a case, even if the measured value is steeply decreased owing to vibrations, performing the second processing prevents the definitive value from changing steeply to reduce the possibility that the operation is determined to be valid despite the user's intension.

The definitive-value determination unit 15 may execute the following processing in place of the first processing. Specifically, if the measured value received from the measured-value detection unit 14 at timing N is less than the sum of the definitive value determined by the definitive-value determination unit 15 itself at timing N−1 and the predetermined increase reference amount Z and greater than the definitive value determined at timing N−1 minus the predetermined decrease reference amount Y, the definitive-value determination unit 15 determines the measured value received at timing N as the definitive value at timing N. In contrast, if the measured value received at timing N is equal to or greater than the sum of the definitive value determined at timing N−1 and the increase reference amount Z, the definitive-value determination unit 15 determines "the sum of the definitive value determined at timing N−1 and the increase reference amount Z" as the definitive value at timing N. If the measured value received at timing N is equal to or less than the definitive value determined at timing N−1 minus the decrease reference amount Y, the definitive-value determination unit 15 determines "the definitive value determined at timing N−1 minus the decrease reference amount Y" as the definitive value at timing N.

Having described the embodiments (including the modifications), it is to be understood that the above embodiments are merely specific examples of the present invention and that the technical scope of the invention is not limited by the embodiments. In other words, the invention can be embodied in various forms without departing from the spirit and principal features.

For example, in the above embodiments, the press target is the display input device 2 provided in a vehicle. However, the press target for which the press detection apparatus 1 incorporating the present invention detects a pressing operation is not limited to the in-vehicle display input device 2. An example is the display input device 2 provided in a place other than the vehicle. Other examples include a smartphone and a tablet terminal in or out of the vehicle and a press switch with a mechanical structure to be pressed by the user (a so-called push button).

In the above embodiments, part or all of the processing to be executed by the functional blocks of the press detection apparatus 1 may be cooperatively executed by the press detection apparatus 1 and an external device. In this case, the press detection apparatus 1 and the external device cooperatively function as "press detection apparatus". For example, part or all of the processing of the definitive-value determination unit 15 may be executed by a cloud server that is communicable with the press detection apparatus 1 over a network.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A press detection apparatus comprising:
  a measured-value detection unit configured to detect a measured value indicating a pressing force applied to a press target in a predetermined cycle; and
  a definitive-value determination unit configured to determine a definitive value for use in a determination of a pressing operation based on the measured value detected by the measured-value detection unit,
  wherein, when a measured value detected by the measured-value detection unit at one timing changes by an amount less than a reference amount from a definitive value determined by the definitive-value determination unit itself at a timing one cycle before the one timing, the definitive-value determination unit determines the measured value detected at the one timing as a definitive value at the one timing, and
  wherein, when the measured value detected at the one timing has changed by an amount equal to or more than the reference amount from the definitive value at the timing one cycle before the one timing, the definitive-value determination unit determines a value obtained by adding the reference amount to the definitive value at the timing one cycle before the one timing as a definitive value at the one timing.

2. The press detection apparatus according to claim 1, wherein the press target is a touch input device provided in a vehicle.

3. The press detection apparatus according to claim 1,
  wherein, when the measured value at the one timing is less than a value obtained by adding an increase reference amount to the definitive value at the timing one cycle before the one timing, the definitive-value determination unit determines the measured value at the one timing as a definitive value at the one timing, and
  wherein, when the measured value at the one timing is equal to or greater than the value obtained by adding the increase reference amount to the definitive value at the timing one cycle before the one timing, the definitive-value determination unit determines the obtained value as a definitive value at the one timing.

4. The press detection apparatus according to claim 3, wherein the press target is a touch input device provided in a vehicle.

5. The press detection apparatus according to claim 1,
  wherein, when the measured value at the one timing is greater than a value obtained by subtracting a decrease reference amount from the definitive value at the timing one cycle before the one timing, the definitive-value determination unit determines the measured value at the one timing as a definitive value at the one timing, and
  wherein, when the measured value at the one timing is equal to or less than the value obtained by subtracting the decrease reference amount from the definitive value at the timing one cycle before the one timing, the definitive-value determination unit determines the obtained value as a definitive value at the one timing.

6. The press detection apparatus according to claim 5, wherein the press target is a touch input device provided in a vehicle.

7. The press detection apparatus according to claim 1,
  wherein, when the measured value at the one timing is less than a value obtained by adding an increase reference amount to the definitive value at the timing one cycle before the one timing and greater than a value obtained by subtracting a decrease reference amount from the definitive value at the timing one cycle before the one timing, the definitive-value determination unit determines the measured value at the one timing as a definitive value at the one timing,
  wherein, when the measured value at the one timing is equal to or greater than the value obtained by adding the increase reference amount to the definitive value at the timing one cycle before the one timing, the definitive-value determination unit determines the value obtained by adding the increase reference amount as a definitive value at the one timing, and
  wherein, when the measured value at the one timing is equal to or less than the value obtained by subtracting the decrease reference amount from the definitive value at the timing one cycle before the one timing, the definitive-value determination unit determines the value obtained by subtracting the decrease reference amount as a definitive value at the one timing.

8. The press detection apparatus according to claim 7, wherein the press target is a touch input device provided in a vehicle.

9. A method for detecting a press with a press detection apparatus including a measured-value detection unit configured to detect a measured value indicating a pressing force applied to a press target in a predetermined cycle, the method comprising:
  receiving, by a definitive-value determination unit of the press detection apparatus, a measured value detected by the measured-value detection unit; and
  when a measured value detected by the measured-value detection unit at one timing changes by an amount less than a reference amount from a definitive value determined by the definitive-value determination unit itself at a timing one cycle before the one timing, determining by the definitive-value determination unit the measured value detected at the one timing as a definitive value at the one timing, but when the measured value detected at the one timing has changed by an amount equal to or more than the reference amount from the definitive value at the timing one cycle before the one timing, determining by the definitive-value determination unit a value obtained by adding the reference amount to the definitive value at the preceding timing as a definitive value at the one timing.

10. The press detection method according to claim 9, wherein, when the measured value at the one timing is greater than a value obtained by subtracting a decrease reference amount from the definitive value at the timing one cycle before the one timing, determining by the definitive-value determination unit the measured value at the one timing as a definitive value at the one timing, but when the measured value at the one timing is equal to or less than the value obtained by subtracting the decrease reference amount from the definitive value at the timing one cycle before the one timing, determining by the definitive-value determination unit the obtained value as a definitive value at the one timing.

11. The press detection method according to claim 10, wherein the press target is a touch input device provided in a vehicle.

12. The press detection method according to claim 9, wherein, when the measured value at the one timing is less than a value obtained by adding an increase reference amount to the definitive value at the timing one cycle before the one timing and greater than a value obtained by subtracting a decrease reference amount from the definitive value at the timing one cycle before the one timing, determining by the definitive-value determination unit the measured value at the one timing as a definitive value at the one timing, but when the measured value at the one timing is equal to or greater than the value obtained by adding the increase reference amount to the definitive value at the timing one cycle before the one timing, determining by the definitive-value determination unit the value obtained by adding the increase reference amount as a definitive value at the one timing, and when the measured value at the one timing is equal to or less than the value obtained by subtracting the decrease reference amount from the definitive value at the timing one cycle before the one timing, determining by the definitive-value determination unit the value obtained by subtracting the decrease reference amount as a definitive value at the one timing.

13. The press detection method according to claim 12, wherein the press target is a touch input device provided in a vehicle.

* * * * *